US007203382B2

(12) United States Patent
Mattausch et al.

(10) Patent No.: US 7,203,382 B2
(45) Date of Patent: Apr. 10, 2007

(54) PATTERN MATCHING AND PATTERN RECOGNITION SYSTEM, ASSOCIATIVE MEMORY APPARATUS, AND PATTERN MATCHING AND PATTERN RECOGNITION PROCESSING METHOD

(75) Inventors: Hans Juergen Mattausch, Higashihiroshima (JP); Tetsushi Koide, Higashihiroshima (JP)

(73) Assignee: President of Hiroshima University, Higashihiroshima-shi (JP)

( * ) Notice: Subject to any disclaimer, the term of this patent is extended or adjusted under 35 U.S.C. 154(b) by 849 days.

(21) Appl. No.: 10/453,636

(22) Filed: Jun. 4, 2003

(65) Prior Publication Data

US 2003/0229636 A1   Dec. 11, 2003

(30) Foreign Application Priority Data

Jun. 6, 2002   (JP)   ............................. 2002-165769

(51) Int. Cl.
*G06K 9/00*   (2006.01)
(52) U.S. Cl. .................. 382/305; 382/181; 707/3; 707/6; 365/49; 365/98; 365/230.01
(58) Field of Classification Search ................ 382/305, 382/209, 181, 218, 221; 707/3, 6; 365/49, 365/98, 230.01
See application file for complete search history.

(56) References Cited

U.S. PATENT DOCUMENTS

| 5,218,562 | A | * | 6/1993 | Basehore et al. | ............ | 708/422 |
| 6,138,116 | A | * | 10/2000 | Kitagawa et al. | .............. | 707/5 |
| 6,693,815 | B2 | * | 2/2004 | Mattausch et al. | ............ | 365/49 |
| 7,113,416 | B2 | * | 9/2006 | Koide et al. | .................. | 365/49 |

FOREIGN PATENT DOCUMENTS

| EP | 1 227 497 | 7/2002 |
| JP | 64-19483 | 1/1989 |
| JP | 7-271816 | 10/1995 |
| JP | 11-45340 | 2/1999 |
| JP | 2001-184871 | 7/2001 |

OTHER PUBLICATIONS

Toshiyuki Nozawa, et al. "A Parallel Vecto-Quantization Processor Eliminating Redundant Calculations for Real-Time Motion Picture Compression" IEEE Journal of Solid-State Circuits, vol. 35, No. 11, Nov. 2000, pp. 1744-1751.

(Continued)

*Primary Examiner*—Jingge Wu
*Assistant Examiner*—Shefali Patel
(74) *Attorney, Agent, or Firm*—Oblon, Spivak, McClelland, Maier & Neustadt, P.C.

(57) ABSTRACT

A plurality of reference words based on a second distance index that allows coding of a first distance index are registered in an associative memory core in advance. In a first pipeline stage, a retrieved word having a predetermined number of bits is extracted from input data in a predetermined clock cycle, and the retrieved word is coded with the second distance index and output to the core. In a second pipeline stage, the core searches for a reference word inhabiting the largest similarity with respect to the retrieved word (winner) obtained in the previous clock cycle. In a third pipeline stage, the core output result in the previous clock cycle is analyzed, one winner is determined on the basis of a specific priority, and an address indicating the location of the winner and the distance between the input data and the winner are coded and output.

13 Claims, 5 Drawing Sheets

OTHER PUBLICATIONS

Stefan Jung, et al. "A Low-Power and High-Performance CMOS Fingerprint Sensing and Encoding Architecture" IEEE Journal of Solid-State Circuits, vol. 34, No. 7, Jul. 1999, pp. 978-984.

Satoshi Shigematsu, et al. "A Single-Chip Fingerprint Sensor and Identifier" IEEE Journal of Solid-State Circuits, vol. 34, No. 12, Dec. 1999, pp. 1852-1859.

Hans Jürgen Mattausch, et al, "An Architecture for Compact Associative Memories with Deca-NS Nearest-Match Capability up to Large Distances" ISSCC Dig. of Tech. Papers, 2001, pp. 170-171, 443.

Patent Abstracts of Japan, JP 11-045340, Feb. 16, 1999.

T. Gyohten, et al., Internet Citation, 'Online!, Material for IP-Award Application, XP-002255801, pp. 1-6, "An Architecture for High-Speed and Compact Associative-Memory Macros", 2000.

M. Van De Panne, et al., IEEE Pacific Rim Conference on Communications, Computers and Signal Processing XP-010084458, pp. 612-615, "MACHAM: A Best Match Content Addressable Memory", Jun. 1, 1989.

H. J. Mattausch, et al., Symposium on VLSI Circuits Digest of Technical Papers, XP-002255802, pp. 252-255, "Fully-Parallel Patern-Matching Engine with Dynamic Adaptability to Hamming or Manhattan Distance", 2002.

* cited by examiner

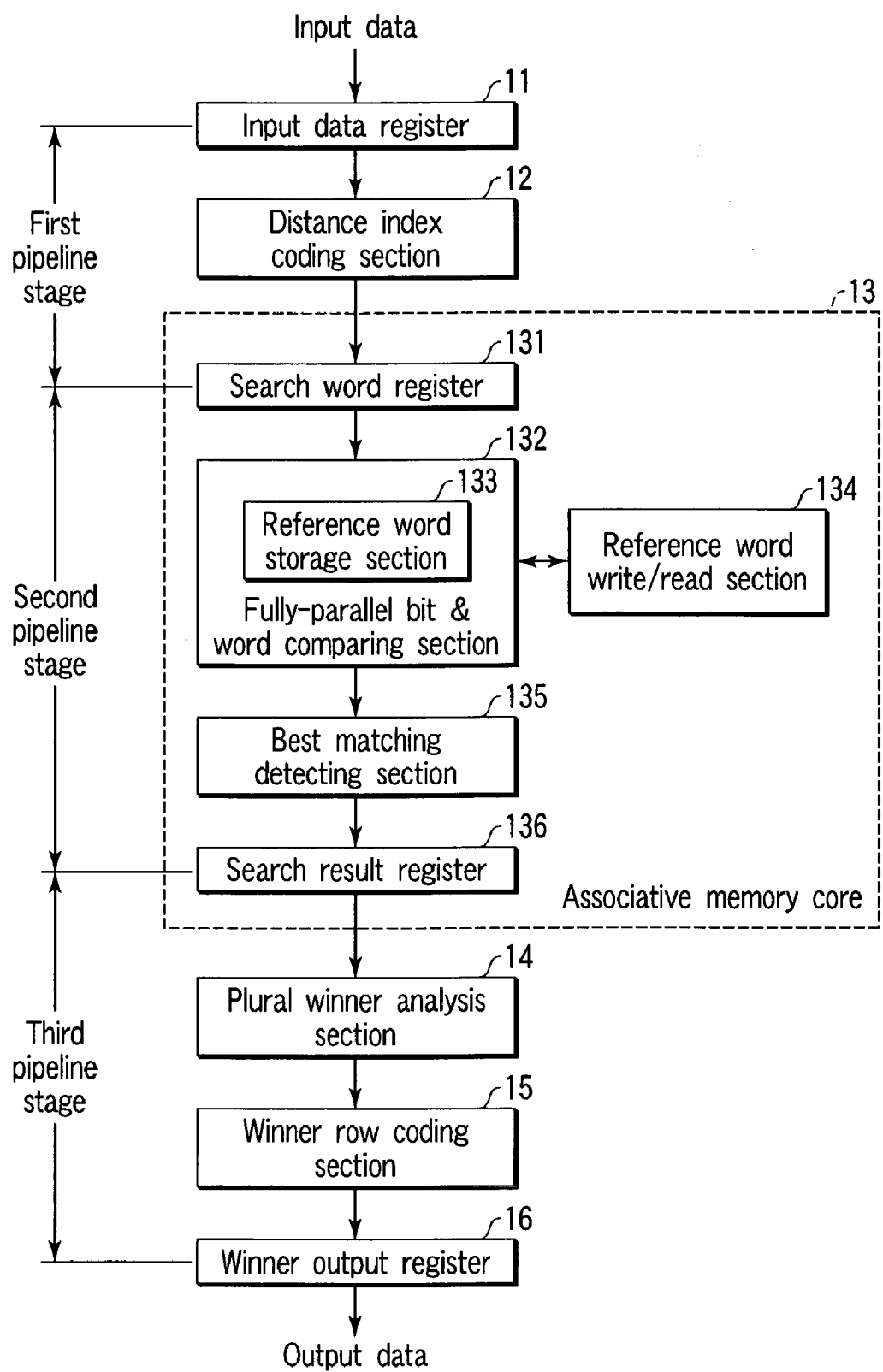
F I G. 1

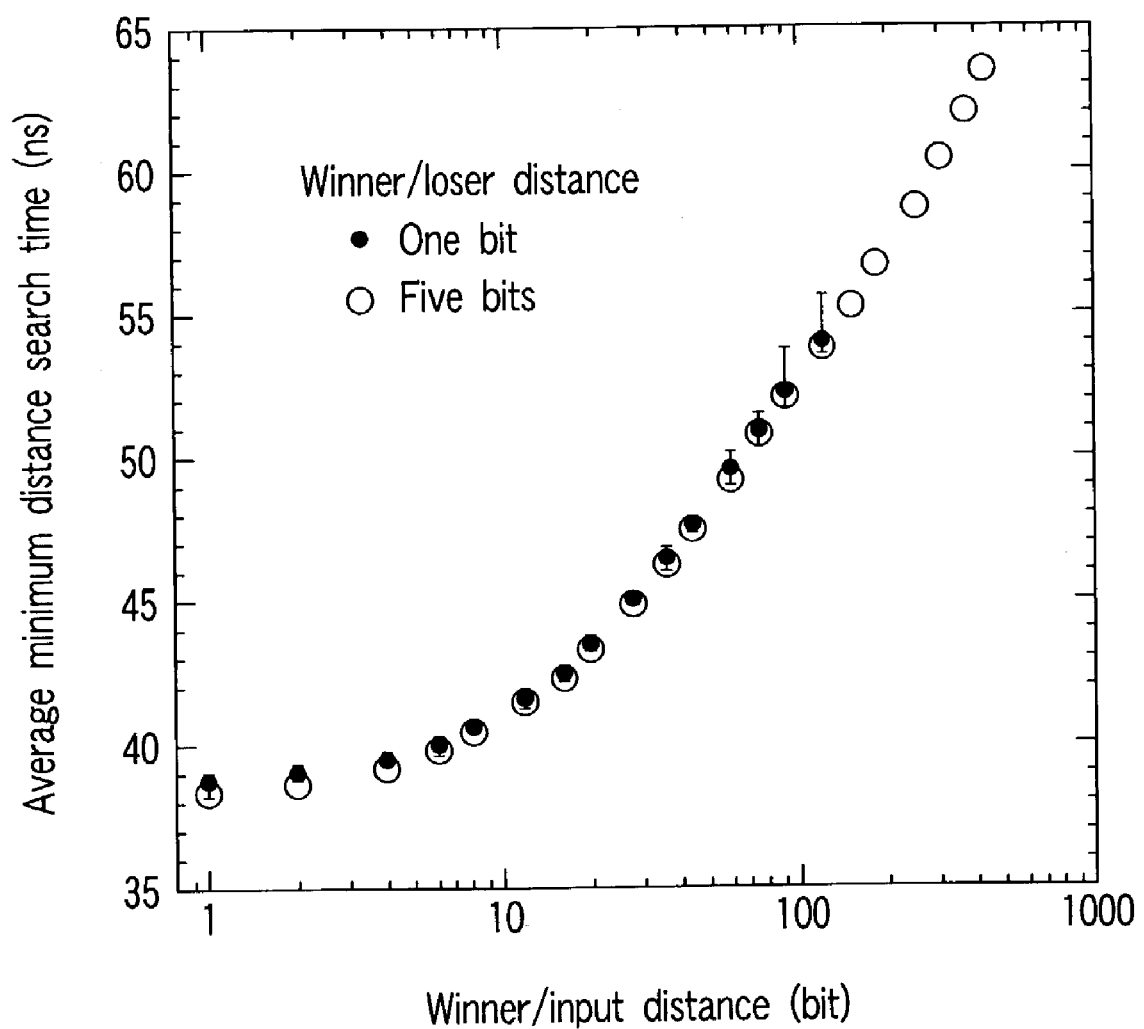
F I G. 5

PATTERN MATCHING AND PATTERN RECOGNITION SYSTEM, ASSOCIATIVE MEMORY APPARATUS, AND PATTERN MATCHING AND PATTERN RECOGNITION PROCESSING METHOD

CROSS-REFERENCE TO RELATED APPLICATIONS

This application is based upon and claims the benefit of priority from the prior Japanese Patent Application No. 2002-165769, filed Jun. 6, 2002, the entire contents of which are incorporated herein by reference.

BACKGROUND OF THE INVENTION

1. Field of the Invention

The present invention relates to a pattern matching and pattern recognition system which is applied to an application that demands different distance indexes, e.g., an artificial intelligence system, data bank system, Internet router, or mobile terminal (e.g., mobile videophone) to determine a pattern, of the reference patterns in a database, which is a most similar (nearest distance) to an input pattern, an associative memory apparatus used in the system, and a pattern matching and pattern recognition processing method.

2. Description of the Related Art

Pattern matching and pattern recognition are a basic function in many application fields developed in the information technology (IT) society, including network routers, codebook-based data compression, target recognition, and the like. In applications, in particular, different distance indexes may be advantageously used for necessary pattern recognition and pattern matching.

When pattern matching and pattern recognition are performed using various kinds of different distance indexes, a pattern exhibiting the largest similarity (nearest distance) with respect to an input pattern is determined from the reference patterns in a database. A proper distance index is selected in accordance with the type of pattern to be recognized. Among applications which have recently attracted a great deal of attention, and which demand short search times, and place importance on real-time performance, examples that have different distance indexes are video signal compression using vector quantization (Manhattan distance) [reference 1] and fingerprint recognition (Hamming distance) [references 2 and 3].

Reference 1: T. Nozawa et al., "A Parallel Vector-Quantization Processor Eliminating Redundant Calculations for Real-Time Motion Picture Compression", IEEE J. Solid-State Circuits, vol. 35, pp. 1744–1751, 2000.

Reference 2: S. Jung et al., "A Low-Power and High-Performance CMOS Fingerprint Sensing and Encoding Architecture", IEEE J. Solid-State Circuits, vol. 34, pp. 978–984, 1999.

Reference 3: S. Shigematsu et al., "A Single-Chip Fingerprint Sensor and Identifier", IEEE J. Solid-State Circuits, vol. 34, pp. 1852–1859, 1999.

The adaptability of conventional pattern recognition systems with respect to different distance indexes currently depends on software, and there is currently no solution based on efficient hardware. Attention is being given to the implementation of efficient hardware as a useful technique because it can achieve practicality in a wide range.

BRIEF SUMMARY OF THE INVENTION

It is an object of the present invention to propose an architecture which can be implemented in a small-area, high-throughput integrated circuit and exhibits adaptability with respect to different distance indexes, and to provide a pattern matching and pattern recognition system which can implement a high-performance, real-time application using the same hardware elements based on the architecture, an associative memory apparatus used in the system, and a pattern matching and pattern recognition processing method.

According to the present invention, there is provided a pattern matching and pattern recognition system for performing pattern matching and pattern recognition of input data, characterized by comprising an associative memory core which includes registration means for selectively registering a plurality of reference words based on a second distance index that allows coding of a first distance index, simultaneously and parallelly performs bit comparison and word weighting comparison for all the plurality of reference words with respect to the input word in a predetermined clock cycle on the basis of the input word, and searches for a word exhibiting the largest similarity (minimum distance) with respect to the input word as a winner, retrieved word extraction means for extracting a retrieved word having a predetermined number of bits from the input data in the clock cycle, first coding means for coding the retrieved word, extracted by the retrieved word extraction means, with the second distance index, and outputting the word to the associative memory core, analysis means for analyzing an output result from the associative memory core in a previous clock cycle, and if a search result includes a plurality of winners, determining one winner on the basis of a specific priority criterion, and second coding means for coding an index (address) indicating a location of a row of the winner determined by the analysis means and a distance based on the first distance index between input data and the winner, and outputting the index and the distance, wherein the retrieved word extraction means and the first coding means are executed in a first pipeline stage, winner search by the associative memory core is executed in a second pipeline stage, and the analysis means and the second coding means are executed in a third pipeline stage.

In addition, according to the present invention, there is provided an associative memory core apparatus included in the system, which is characterized by comprising a memory area processing section including a search word register which stores a retrieved word, a reference word storage section which stores a plurality of reference words based on an arbitrary distance index, and a comparing section which simultaneously and parallelly performs bit comparison processing and word weighting comparison processing with respect to the retrieved word stored in the search word register and all the reference words stored in the reference word storage section, a registration processing section for selectively registering the reference words in the reference word storage section, a best matching detecting section for searching for a reference word exhibiting the largest similarity (minimum-distance) with respect to the retrieved word as a winner from a comparison result obtained by the comparing section, and a search result register which stores a search result obtained by the best matching detecting section.

Furthermore, according to the present invention, there is provided a pattern matching and pattern recognition processing method of performing pattern matching and pattern recognition of input data by using an associative memory core which includes registration means for selectively registering a plurality of reference words based on a second distance index that allows coding of a first distance index, and simultaneously and parallelly performs bit comparison and word weighting comparison for all the plurality of reference words with respect to an input word, characterized by comprising a preparing step of registering a plurality of reference words each having a predetermined number of bits based on the second distance index in the associative memory core, a coding step of sequentially extracting retrieved words each having a predetermined number of bits from the input data in a predetermined clock cycle, a search step of inputting a retrieved word coded in a previous clock cycle in the coding step in the associative memory core, simultaneously and parallelly performing bit comparison and word weighting comparison for each of the plurality of reference words registered in the preparing step and the retrieved word, and searching for a word exhibiting the largest similarity (nearest distance) with respect to the retrieved word as a winner from the comparison result, and an output processing step of checking whether a search result obtained in a previous clock cycle in the search step, determining one winner in accordance with a specific priority criterion, coding an index (address) indicating a location of a row of the winner and a distance based on the first distance index between input data and the winner, and outputting the index and the distance.

Additional objects and advantages of the present invention will be set forth in the description which follows, and in part will be obvious from the description, or may be learned by practice of the present invention. The objects and advantages of the invention may be realized and obtained by means of the instrumentalities and combinations particularly pointed is out hereinafter.

BRIEF DESCRIPTION OF THE SEVERAL VIEWS OF THE DRAWING

The accompanying drawings, which are incorporated in and constitute a part of the specification, illustrate presently preferred embodiments of the present invention and, together with the general description given above and the detailed description of the preferred embodiments given below, serve to explain the principles of the present invention.

FIG. 1 is a block diagram showing a system arrangement based on a fully-parallel pattern matching and pattern recognition architecture having an adaptive distance index according to an embodiment of the present invention;

FIG. 5 is a graph showing a relationship with the average measurement minimum distance search time required by the associative memory test chip when the distance between the most similar (minimum distance) reference word (winner) and the nearest reference data (loser) is one bit and five bits.

DETAILED DESCRIPTION OF THE INVENTION

Figure 2:
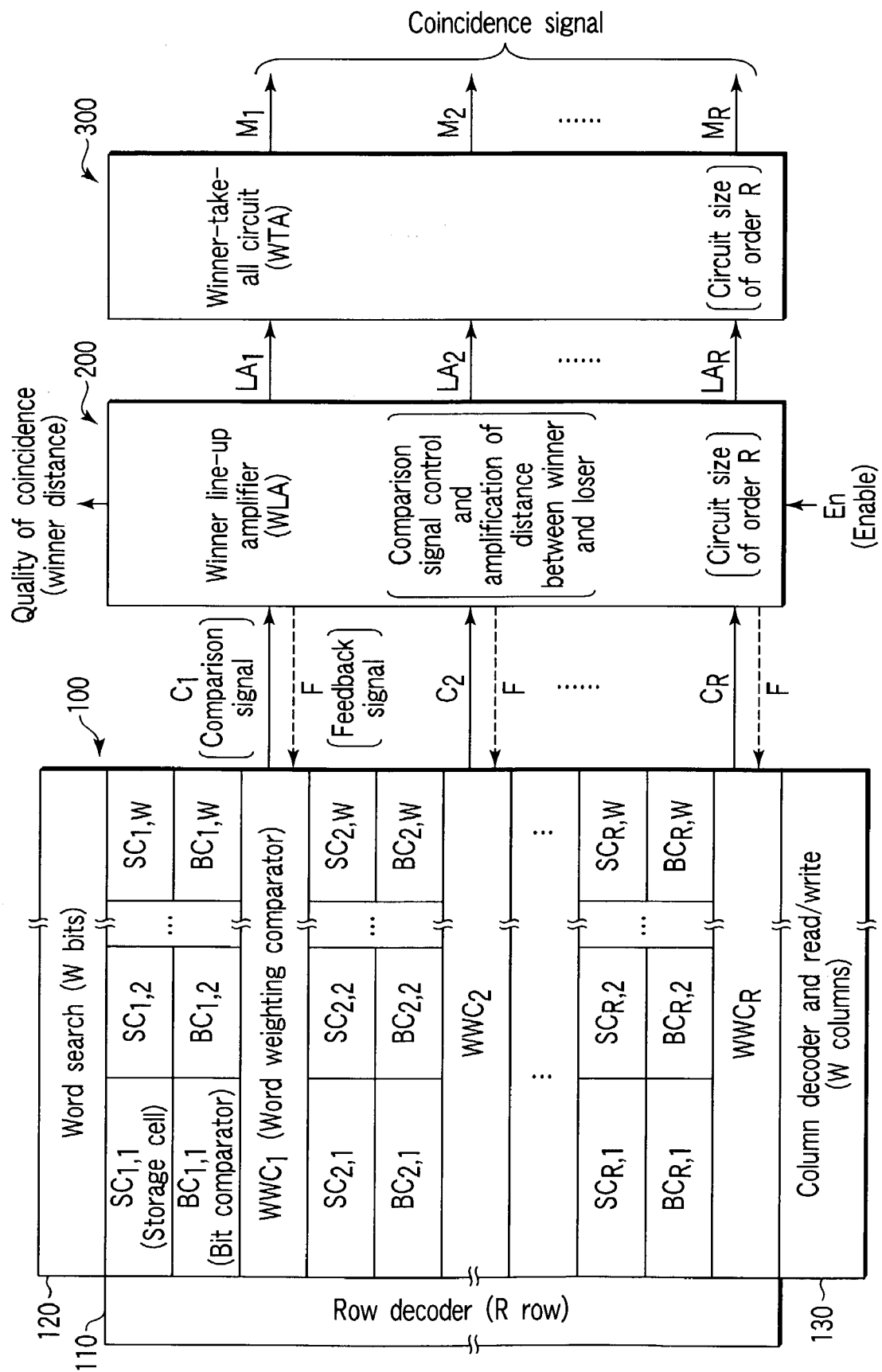
FIG. 2 is a block diagram showing the arrangement of a fully-parallel, small-area associative memory having a search function for searching for a reference pattern exhibiting the largest similarity (minimum distance) with respect to the retrieved word based on the Hamming distance according to this embodiment.

An embodiment of the present invention will be described in detail below with reference to the several views of the accompanying drawings.

FIG. 1 is a block diagram showing a system arrangement based on a fully-parallel pattern matching and pattern recognition architecture having an adaptive distance index according to an embodiment of the present invention. A characteristic feature of this system is that it uses an architecture for searching for a most similar (minimum distance) reference pattern by high-speed and fully-parallel processing, and a small-area associative memory core having a fixed distance index that allows easy coding of another distance index.

As shown in FIG. 1, the basic processing in this system is constituted by (1) a first pipeline stage for coding the words of an input stream data, (2) a second pipeline stage for searching for the best similarity (minimum distance) between each word of the coded data and a reference word by fully-parallel processing, and (3) a third pipeline stage for analyzing a plurality of best similarity (minimum distance) reference words (winners) and coding an index (address) indicating the location of a row of a reference word at the best similarity (minimum distance) and the distance between the input data and the winner on the basis of the analysis result. Note that before a pattern matching phase based on the above pipeline processing is started, it is necessary to load a reference word pattern in the associative memory core.

Referring to FIG. 1, the input stream data is temporarily stored in an input data register 11. A distance index coding section 12 sequentially reads out retrieved words from the input data register 11, and codes each word with a predetermined distance index. The coded retrieved words are sent to an associative memory core 13 and stored in a search word register 131.

In the associative memory core 13, a fully-parallel bit & word comparing section 132 has a reference word storage section 133 in which reference words are stored in advance. A plurality of reference words based on a predetermined desired distance index are registered in the reference word storage section 133 by processing performed by a reference word write/read section 134. The fully-parallel bit & word comparing section 132 reads out a plurality of reference words from the reference word storage section 133, and simultaneously and parallelly performs bit comparison and word comparison between the respective reference words and the retrieved words stored in the search word register 131 in the previous clock cycle. A best matching detecting section 135 searches for a word exhibiting the largest similarity (nearest distance) with respect to the retrieved word (to be referred to as a winner hereinafter) on the basis of the comparison result on the respective reference words. This search result is stored in a search result register 136.

A plural winner analysis section 14 checks whether the search result stored in the search result register 136 in the previous clock cycle includes a plurality of winners. If there is a plurality of winners, the plural winner analysis section 14 determines one winner according to a specific priority determination algorithm. A winner row coding section 15 codes an index (address) indicating the location of the row of the winner determined by the plural winner analysis section 14 and the distance between the input data and the winner. This coded data is stored in a winner output register 16 and sequentially output as output stream data.

The operation principle of the above arrangement will be described below.

Hamming distance is the best selection as a distance index in the associative memory core. This is because the Hamming distance is practically important, and an architecture (see FIG. 2) for high-speed fully-parallel best similarity (minimum distance) search which can be implemented by a simple circuit [reference 4: H. J. Mattausch et al., "An Architecture for Compact Associative Memories with Decans Nearest-Match Capability up to Large Distances", ISSCC Dig. of Tech. Papers, pp. 170–171, 2001; Japanese Patent Application No. 2002-008783 (Jan. 17, 2002) with priority claim based on Japanese Patent Application No. 2001-11760 (Jan. 19, 2001)]. In addition, the Hamming distance allows easy coding of another distance index. Table 1 shows an example of coded data for Manhattan distance search based on Hamming distance search hardware when $2^k-1$ (=7) bits are required with respect to a k(=3)-bit binary number. In this example, each data is coded by sequentially converting bits into 1 from the least significant bit by the number of bits corresponding to the decimal expression of a corresponding k-bit binary number.

TABLE 1

| Decimal Number | Binary Number (3 Bit) | Manhattan Distance Search Coded Data (7 Bits) Based on Hamming Distance Search Hardware (7 Bit) |
|---|---|---|
| 0 | 000 | 0000000 |
| 1 | 001 | 0000001 |
| 2 | 010 | 0000011 |
| 3 | 011 | 0000111 |
| 4 | 100 | 0001111 |
| 5 | 101 | 0011111 |
| 6 | 110 | 0111111 |
| 7 | 111 | 1111111 |

FIG. 2 is a block diagram showing the arrangement of a fully-parallel small-area semiconductor associative memory having a best similarity (minimum distance) search function based on Hamming distance according to this embodiment. This semiconductor associative memory is comprised of a memory area 100, a winner/loser line-up amplifier (to be referred to as a WLA hereinafter) 200 which performs winner/lower distance amplification, and a winner-take-all circuit (to be referred to as a WTA hereinafter) 300.

The memory area 100 is constituted by R rows having integrated bit comparators $BC_{i,j}$ (i=1 to R and j=1 to W; the ranges of the suffixes i and j remain the same in the following description), W columns of storage cells $SC_{i,j}$, and word weighting comparators $WWC_i$ (to be simply referred to as $WWC_i$ hereinafter) which performs weighting operation in word comparison.

In the memory area 100, an R-row row decoder 110 is connected to the left side in FIG. 2, and a word search section 120 which receives input data (W bits) is arranged on the upper side in FIG. 2. A W-column column decoder 130 is connected to the lower side in FIG. 2 to read and write data on a storage cell basis. Note that W-bit reference words are stored in the respective storage cells $SC_{i,j}$ in advance, and a reference word exhibiting the largest similarity (minimum distance) with respect to the W-bit input word input to the word search section 120 is read out as a winner.

The above winner selection is executed by the WLA 200 and WTA 300. In this case, the WLA 200 controls the level of a comparison signal $C_i$ to amplify the differences in distance between the winner (the most similar reference word to the input word) and the losers (the reference words other than the winner) so as to maximize them in the first stage. The WLA 200 performs self adjustment such that a comparison signal $C_{win}$ (taking a value at the minimum level) for the winner automatically falls within the WLA's maximum gain range by a feedback loop.

Upon reception of a distance output signal $LA_j$ from the WLA 200, the WTA 300 outputs a coincidence signal $M_i$. The coincidence signal $M_i$ is "1" for a winner row, and "0" for all the remaining rows (loser rows). In this manner, a winner is determined finally. Note that the comparison signal $C_i$ from $WWC_i$ is input to the input section of the WLA 200, and a feedback signal F is returned from the WLA 200.

Figure 3:
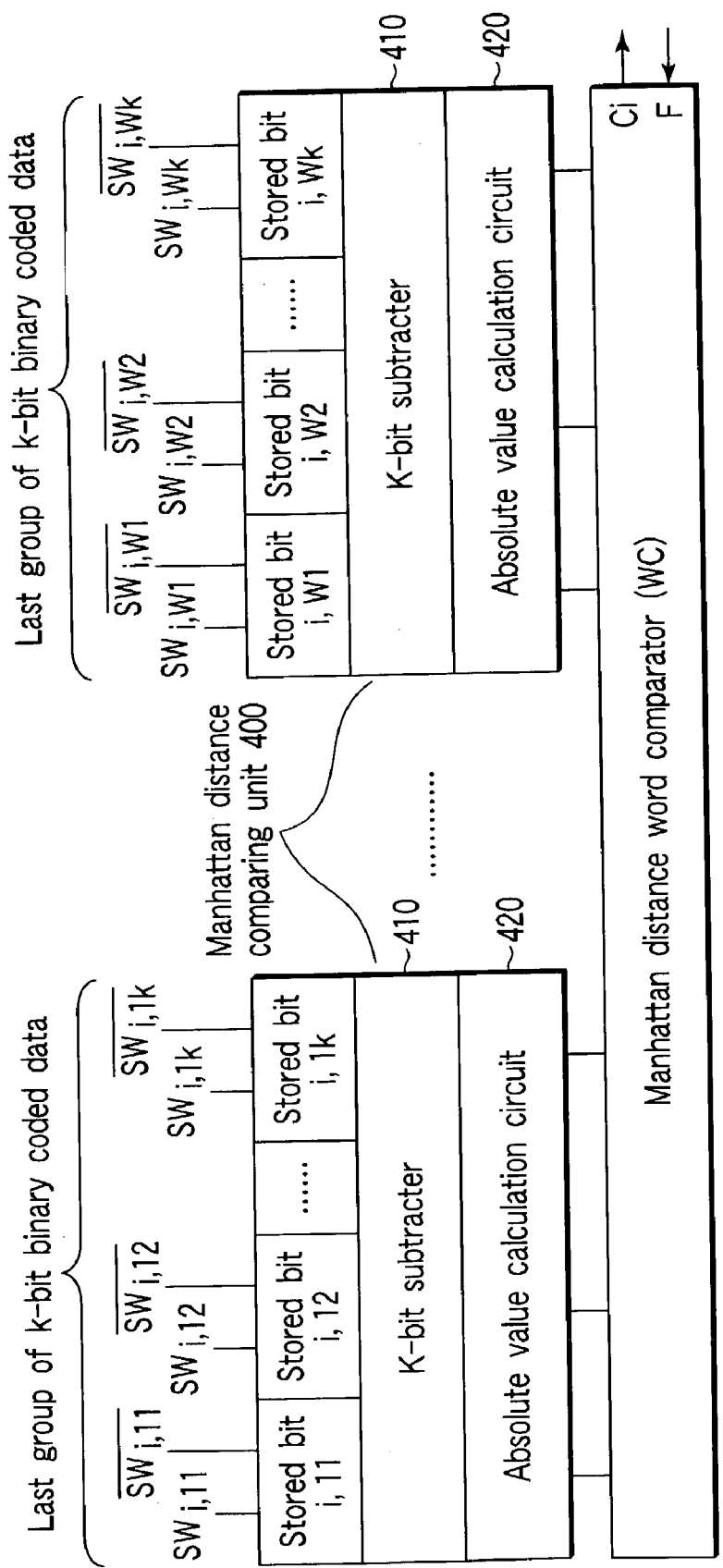
FIG. 3 is a block diagram showing the architecture of the memory area of a digital/analog associative memory core which directly implements the Manhattan distance.

Assume that Manhattan distance is to be directly implemented by a fully-parallel associative memory core. In this case, as shown in FIG. 3, a k-bit subtracter 410 and absolute value calculation circuit 420 are prepared for each of Manhattan distance comparing units 400 from the first to last groups of k-bit binary coded data to make a Manhattan distance word comparator (WC) 500 perform word comparison based on the absolute values of the respective groups. This hardware requires an area for the integration of the k-bit subtracter 410 and absolute value calculation circuit 420 in each group, and further increases the delay time in a critical path for best similarity (minimum distance) search.

A Manhattan distance calculation is therefore mapped in Hamming distance hardware. This makes it possible to remove the circuitry for k-bit subtraction and absolute value calculation, which are factors for increases in area and delay, from the associative memory core. This mapping cost is $2^k-1$ with respect to a bit count k. Therefore, there is no influence on a reduction in delay time, but there is a tradeoff between the merit and the area required. Since the realistic number of transistors required for the circuitry for subtraction and absolute value calculation is 24 per bit, this number of transistors omitted in the memory area of an associative memory by mapping should be smaller than the additional number of transistors required for storing the increased number of bits. A conditional expression (1) results for the case of mapping the Manhattan on to the Hamming distance, given by $$9(2^k-1)=\text{transistors (mapped)}<30k+2^k=\text{transistors (not mapped)} \quad (1)$$

When k is solved for conditional expression (1), k<4.03. When, therefore, Manhattan distance search is mapped on Hamming distance hardware, the area of the associative memory can be decreased without increasing the best similarity (minimum distance) search time up to a 4-bit binary number.

A fully-parallel pattern matching and pattern recognition system according to the present invention shown in FIG. 1 will be described in detail below on the basis of the above operation principle.

In the system shown in FIG. 1, a pattern matching architecture is constituted by two phase modes. One is a preparatory phase mode. This mode is a mode for loading a new reference word into the reference word storage section 133 in the associative memory core 13 or accessing the reference word storage section 133 to read a reference word therefrom. The other is a pattern matching phase mode. This mode is based on the principle of a three-stage time overlap pipeline which sequentially and consecutively processes the respective words of input stream data.

The normal operation of hardware according to the present invention is based on a preparatory phase which is followed by a pattern matching phase. In the preparatory phase, the reference words coded in accordance with the distance index implemented by the hardware of the associative memory core 13 are loaded into a reference word storage section 13A. In the pattern matching phase, a winner exhibiting the largest similarity (nearest distance) is determined from the respective reference words with respect to each word of the input stream data by the three-stage pipeline.

In the pattern matching phase, the three-stage pipeline performs the following processing.

In the first pipeline stage, an input data pattern for matching processing is read out from the input data register 11 on the basis of the original distance index. In order to perform matching processing, the input data pattern is coded with the distance index implemented by the associative memory core 13 in the second pipeline stage. The coding result is stored in the search word register 131.

In the second pipeline stage, a search word coded in the previous clock cycle is read out from the search word register 131 and transferred to the associative memory core 13 which performs minimum distance search. In addition, a word exhibiting the minimum distance is determined from the reference words on the basis of the distance index implemented by the associative memory core 13. The minimum distance search result is transferred to the search result register 136.

In the third pipeline stage, it is checked whether the search result in the previous clock cycle includes a plurality of winners. If there is a plurality of winners, one of the winners is selected on the basis of, for example, a priority determination algorithm of assigning higher priority levels to smaller column numbers. Finally, an index (address) indicating the location of a row selected as a winner and the distance between the input data and the winner are coded, and the resultant data is written in the winner output register 16.

Some application may demand to output all winners instead of selecting one of them. In such a case, previously selected winners are deleted from the search result data, and selection processing based on the priority determination algorithm is repeated until indexes (addresses) indicating the locations of all winners and the distances between input data and the winners are coded and stored in the winner output register 16.

All the pipeline stages operate parallelly, and three consecutive data words in the input stream data are simultaneously processed in the consecutive pipeline stages.

In the above embodiment, there are three merits in coding.

The most important merit is that the hardware of the associative memory core (Hamming distance hardware is expected to be best) can be reused for a wide variety of applications.

In addition, a circuit required for a more complicated distance index (e.g., a subtraction and absolute value calculation for Manhattan distance) can be removed from the associative memory core, and corresponding processing can be handled in the first pipeline stage. This shortens the delay time in the circuit for the minimum distance search function and increases the throughput (performance) of the associative memory.

Lastly, the hardware amount required for the core can be reduced in many practical cases. For example, as described above, it is estimated that the hardware of a core for encoding of Manhattan distance search based on the Hamming distance can be reduced up to a 4-bit binary number in many practical applications.

Figure 4:
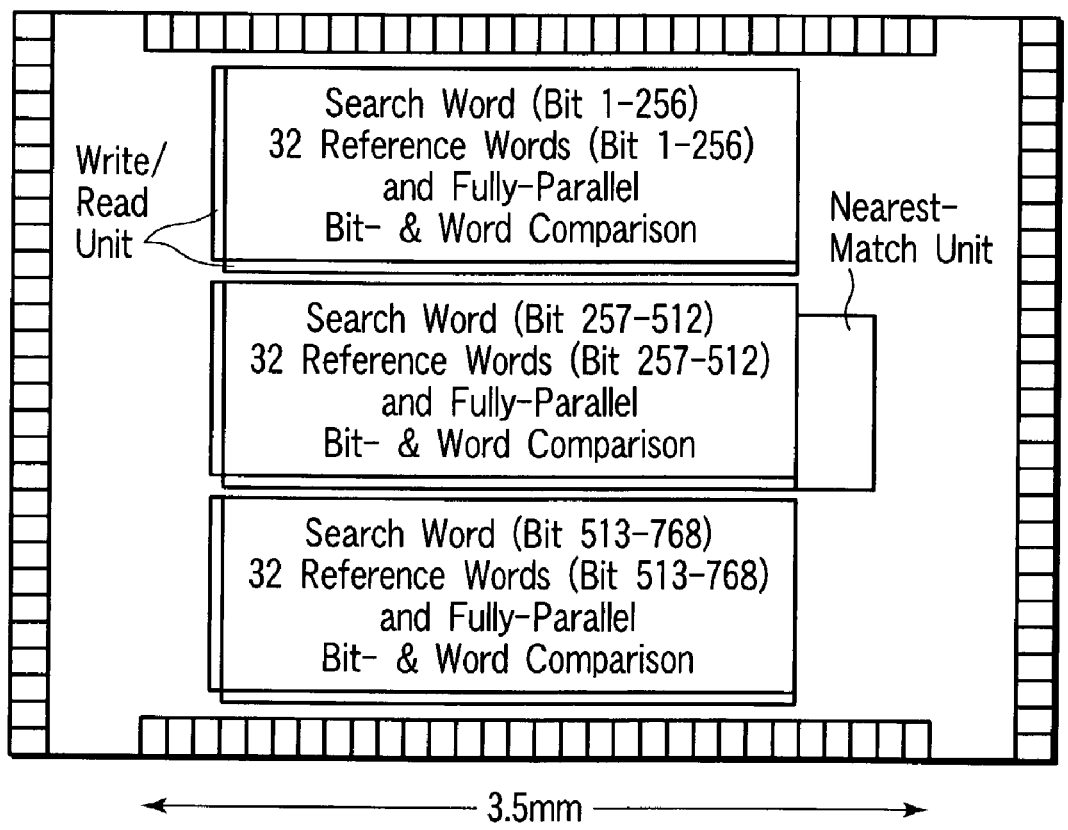
FIG. 4 is a block diagram showing an example of the arrangement of a test chip of the associative memory core of a pattern matching and pattern recognition architecture which has an adaptive distance index and is implemented by a 0.6-μm CMOS technique according to this embodiment.

FIG. 4 shows a photograph of an associative memory core chip manufactured by way of trial for a pattern recognition system that can be applied to an application for minimum distance search for Hamming distance and Manhattan distance. This test chip was manufactured using a 0.6-μm CMOS technique and two-layer polysilicon and three-layer metal wiring steps.

As shown in FIG. 4, in order to accommodate reference word storage cells (SC), a bit comparator (BC), and word weighting comparators (WWC), the memory area of the manufactured semiconductor associative memory is divided into three 32-row, 256-bit fields to have a total word length of 768 bits.

The reference word storage capacity of the memory area is a word length (pattern length) of 32 768-bit reference patterns (a total of 24 k bits). The area is 9.75 mm$^2$, and the area, of the design area, which is occupied by a nearest-match unit constituted by a WLA and WTA is 0.307 mm$^2$, which is only 3.15% of the design area. Of this area, the portion occupied by the WLA is 1.37%, and the portion occupied by the WTA is 1.78%. The search time for a best similarity (minimum distance) is 70 ns or less, the power consumption is 43 mW with a power supply voltage of 3.3 V and an operating frequency of 10 MHz, and the power consumption per reference pattern is 1.35 mW or less.

For this test chip, a word length of 768 bits is selected as a maximum pattern length. With this word length, the chip can be satisfactorily applied to full color motion picture compression into 4×4 pixel blocks (each color data is rounded into a 4-bit expression) or fingerprint recognition (in a case wherein the ridges and grooves of the skins of fingers are reduced to a width of one pixel and then collated with each other).

FIG. 5 shows the results obtained by measuring the search times for average minimum distances in the associative memory shown in FIG. 4 in cases wherein the distance between a best similarity (minimum-distance) reference word (winner) and a nearest reference word (nearest loser) is one bit and five bits.

Referring to FIG. 5, the results obtained by measuring times in 10 physically different places (different rows) with respect to the best similarity (minimum distance) reference word and the nearest reference data are plotted. It is obvious from the magnitudes of error bars that variations in measurement data are very small even in the most critical case wherein the distance between the best similarity (minimum distance) reference word and the nearest reference word is one bit.

Referring to FIG. 5, as the result of measuring the best similarity (minimum distance) search times in the manufactured semiconductor associative memory, it was confirmed that the best similarity (minimum distance) search times were very short, as short as 70 ns or less, with only a power consumption of 1.34 mW per one reference pattern, in cases of winner/loser distances of one bit and five bits when the winner/input distances were 124 or less and 444 bits or less.

The fully-parallel pattern matching and pattern recognition system according to the above embodiment can therefore implement a small-area, high-throughput integrated circuit, in particular, and can implement a high-performance real-time application using the same hardware elements because of an architecture exhibiting high adaptability with respect to different distance indexes.

Note that the present invention is not limited to the above embodiment. For example, the above embodiment has exemplified the case wherein the distance index coding section 12 corresponds to one distance index. In contrast to this, a plurality of coding sections corresponding to a plurality of distance indexes may be prepared in the distance index coding section 12, and one of the coding sections may be selected in accordance with a control signal. This arrangement allows one piece of hardware to process a plurality of distance indexes.

More specifically, when the distance index processed in the associative memory core 13 is the Hamming distance, a coding section for Manhattan distance (conversion processing indicated by Table 1) and a coding section for Hamming distance (through processing) are prepared in the distance index coding section 12, and one of the coding sections is selected by a control signal in accordance with input data. This makes it possible to process two distance indexes using one piece of hardware.

In addition, a similar effect can be obtained by preparing overall processing blocks in the first pipeline stage in accordance with a plurality of distance indexes and combining the blocks in accordance with input data instead of making only the distance index coding section 12 cope with a plurality of distance indexes.

As has been described above, according to the present invention, pattern recognition can be realized by using the same hardware elements because of the architecture exhibiting adaptability with respect to different distance indexes. For this reason, the present invention can be widely applied to pattern matching in, for example, a network router, codebook base data compression, target recognition, artificial intelligence system, data bank system, Internet router, and mobile terminal (e.g., mobile video terminal).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern matching and pattern recognition system for performing pattern matching and pattern recognition of input data, comprising:

an associative memory core which includes registration means for selectively registering a plurality of reference words based on a second distance index that allows coding of a first distance index, simultaneously and parallelly performs bit comparison and word weighting comparison for all said plurality of reference words with respect to the input word in a predetermined clock cycle on the basis of the input word, and searches for a word exhibiting the largest similarity (minimum distance) with respect to the input word as a winner;

retrieved word extraction means for extracting a retrieved word having a predetermined number of bits from the input data in the clock cycle;

first coding means for coding the retrieved word, extracted by the retrieved word extraction means, with the second distance index, and outputting the word to the associative memory core;

analysis means for analyzing an output result from the associative memory core in a previous clock cycle and, if a search result includes a plurality of winners, determining one winner on the basis of a specific priority criterion; and second coding means for coding an index (address) indicating a location of a row of the winner determined by the analysis means and a distance based on the first distance index between input data and the winner, and outputting the index and the distance, wherein the retrieved word extraction means and the first coding means are executed in a first pipeline stage, winner search by the associative memory core is executed in a second pipeline stage, and the analysis means and the second coding means are executed in a third pipeline stage.

2. A system according to claim 1, wherein the first coding means passes an input received word when the first distance index coincides with the second distance index.

3. A system according to claim 1, wherein the first coding means comprises a plurality of coding processing means corresponding to a plurality of distance indexes existing as the first distance index, and selection means for selecting the coding processing means in accordance with the type of the input data.

4. A system according to claim 1, wherein when $2^k-1$ bits are required with respect to a k-bit binary number, the first coding means codes the number by sequentially converting bits from a least significant bit by a number of bits corresponding to a decimal expression of the k-bit binary number.

5. A system according to claim 1, wherein the second distance index is a Hamming distance.

6. A system according to claim 5, wherein the first distance index is a Manhattan distance.

7. An associative memory core apparatus included in the system according to claim 1, comprising:

a memory area processing section including a search word register which stores a retrieved word, a reference word storage section which stores a plurality of reference words based on an arbitrary distance index, and a comparing section which simultaneously and parallelly performs bit comparison processing and word weighting comparison processing with respect to the retrieved word stored in the search word register and all the reference words stored in the reference word storage section;

a registration processing section for selectively registering the reference words in the reference word storage section;

a best matching detecting section for searching for a reference word exhibiting the largest similarity (minimum-distance) with respect to the retrieved word as a winner from a comparison result obtained by the comparing section; and a search result register which stores a search result obtained by the best matching detecting section.

8. A pattern matching and pattern recognition processing method of performing pattern recognition of input data by using an associative memory core which includes registration means for selectively registering a plurality of reference words based on a second distance index that allows coding of a first distance index, and simultaneously and parallelly performs bit comparison and word weighting comparison for all the plurality of reference words with respect to an input word, comprising:

a preparing step of registering a plurality of reference words each having a predetermined number of bits based on the second distance index in the associative memory core;

a coding step of sequentially extracting retrieved words each having a predetermined number of bits from the input data in a predetermined clock cycle;

a search step of inputting a retrieved word coded in a previous clock cycle in the coding step in the associative memory core, simultaneously and parallelly performing bit comparison and word weighting comparison for each of the plurality of reference words registered in the preparing step and the retrieved word, and searching for a word exhibiting the largest similarity (nearest distance) with respect to the retrieved word as a winner from the comparison result; and an output processing step of checking whether a search result obtained in a previous clock cycle in the search step has a plurality of winners, determining one winner in accordance with a specific priority criterion, coding an index (address) indicating a location of a row of the winner and a distance based on the first distance index between input data and the winner, and outputting the index and the distance.

9. A method according to claim 8, wherein in the coding step, when the first distance index coincides with the second distance index, an input retrieved word is passed.

10. A method according to claim 8, wherein the coding step comprises a plurality of coding processing steps corresponding to a plurality of distance indexes existing as the first distance index, and a selection step of selecting the coding processing step in accordance with the type of the input data.

11. A method according to claim 8, wherein in the coding step, when $2^k-1$ bits are required with respect to a k-bit binary number, the number is coded by sequentially converting bits from a least significant bit by a number of bits corresponding to a decimal expression of the k-bit binary number.

12. A method according to claim 8, wherein the second distance index is a Hamming distance.

13. A method according to claim 12, wherein the first distance index is a Manhattan distance.

* * * * *